United States Patent [19]

Uehara et al.

[11] 4,197,555
[45] Apr. 8, 1980

[54] SEMICONDUCTOR DEVICE

[75] Inventors: Takao Uehara, Tokyo; Takamitsu Tsuchimoto, Machida; Katsuyuki Hamada, Kawasaki; Hideo Masuzawa, Tokyo; Makoto Mukai, Hino, all of Japan

[73] Assignee: Fujitsu Limited, Japan

[21] Appl. No.: 925,788

[22] Filed: Jul. 18, 1978

Related U.S. Application Data

[63] Continuation of Ser. No. 752,922, Dec. 21, 1976, abandoned.

[30] Foreign Application Priority Data

Dec. 29, 1975 [JP] Japan .................................. 50-159004
Feb. 28, 1976 [JP] Japan .................................. 51-21418
Feb. 28, 1976 [JP] Japan .................................. 51-21419

[51] Int. Cl.² .......................................... H01L 23/48
[52] U.S. Cl. ........................................ 357/70; 357/40; 357/68; 357/71
[58] Field of Search ....................... 357/40, 68, 70, 71

[56] References Cited

U.S. PATENT DOCUMENTS 3,936,865  2/1976  Robinson ............................. 357/68
4,006,492  2/1977  Eichelberger ....................... 357/68

Primary Examiner—Edward J. Wojciechowicz
Attorney, Agent, or Firm—Staas & Halsey

[57] ABSTRACT

An electronic device which includes at least one semiconductor chip with at least one circuit element thereon and connection patterns thereon being connected to the circuit element or elements. The connection patterns comprise a lower connection pattern, which is standardized and widely applicable to many kinds of circuits, and an upper connection pattern, which is positioned on the upper side of said lower connection pattern. The upper connection pattern and the lower connection pattern are connected in conformity with the desired circuit to be obtained.

11 Claims, 28 Drawing Figures

Fig. 8A    Fig. 8B    Fig. 8C
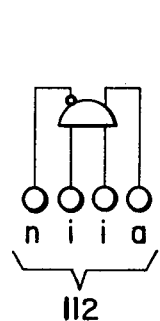
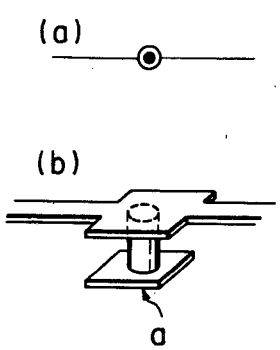
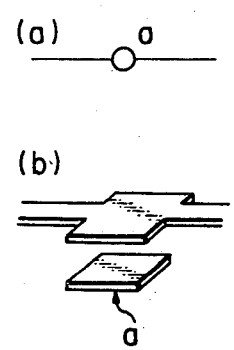
Fig. 9
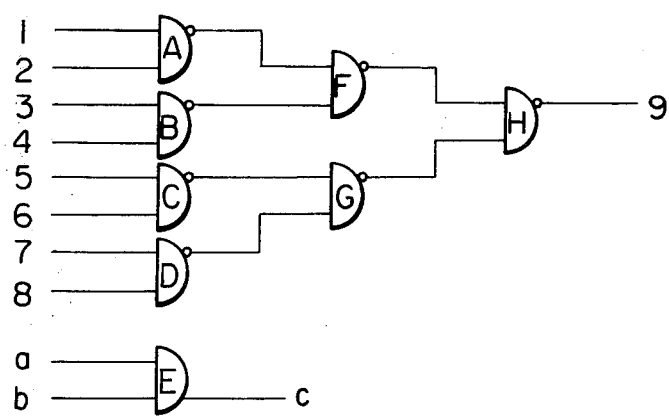

(a)

(b)

4,197,555

SEMICONDUCTOR DEVICE

This is a continuation of application Ser. No. 752,922 filed Dec. 21, 1976, now abandoned.

BACKGROUND OF THE INVENTION

1. Field of the Invention

The present invention relates generally to large-scale integrated semiconductor devices, and more detailedly to a method and technique for forming connection patterns thereon.

2. Description of the Prior Art

In the usual process of manufacturing a large-scale integrated semiconductor device, or a large-scale integrated circuit which includes many diodes, transistors, resistors, or a combination of these elements on a single semiconductor chip, a great number of masks must be prepared for the purpose of forming the various connection patterns in accordance with the desired semiconductor device which is to be manufactured. Also, as each mask is used for forming very fine patterns with high accuracy, the cost for manufacturing the semiconductor device becomes very great.

SUMMARY OF THE INVENTION

An object of the present invention is to provide a semiconductor device which is manufactured by using as few normalized connection patterns and masks therefor as possible.

Another object of the present invention is to provide a semiconductor device which can be manufactured at very low cost.

A further object of the present invention is to provide an electronic device having a main body element provided thereon with a plurality of electrical elements, and connecting means associated with the main body element for providing an electrical circuit pattern for interconnecting at least some of the electrical elements, and additional means associated with the main body element and electrically interconnected with said first means to permit variations in said interconnections in order to permit flexibility and variation of desired circuit designs.

An additional further object of this invention is to provide an electronic device having a pattern of interconnection between electrical elements thereon which may be standardized to permit a number of different circuits to be formed by simply changing by removing or the like portions of the interconnecting patterns.

The foregoing objects of the present invention are attained by providing a semiconductor device which includes at least one semiconductor chip having at least one formed circuit element thereon, and connection patterns associated therewith being connected to said circuit element or elements, wherein said connection patterns comprise a lower connection pattern, which is standardized and applicable to many kinds of circuits, and an upper connection pattern, which is positioned on the upper side of said lower connection pattern. Said upper connection pattern and said lower connection pattern are connected in conformity with the desired circuit to be obtained.

According to the present invention, it is an advantage to standardize said upper pattern for application to many different kinds of circuits, wherein said upper connection pattern and said lower connection pattern are connected at positions which are standardized, and wherein said upper connection pattern is formed by removing lines at positions which are not necessary for obtaining the desired circuit.

It is also an advantage to standardize said upper connection pattern by connecting the upper connection pattern and said lower connection pattern at positions which are necessary for forming the circuit to be obtained.

It is a further advantage to form said upper connection pattern in a special pattern for obtaining the desired circuit.

Other objects and advantages of the present invention will become more apparent from the following detailed description of preferred embodiments thereof, with reference to the accompanying drawings.

BRIEF DESCRIPTION OF THE DRAWINGS

FIGS. 8A, 8B and 8C show a basic pattern and the connections existing between the basic pattern and the connection patterns;

FIG. 9 shows a circuit which is related to the embodiment shown in FIG. 7;

DESCRIPTION OF THE PREFERRED EMBODIMENT

Figure 1:
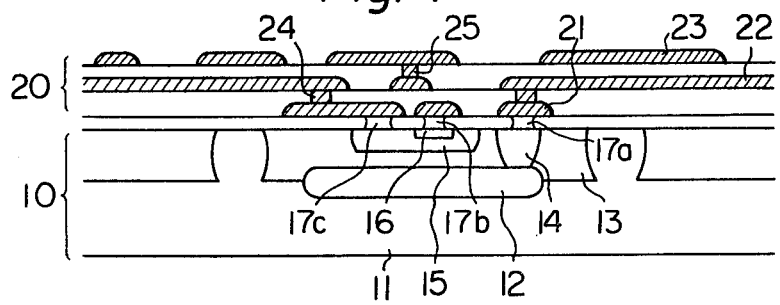
FIG. 1 is a cross sectional view of the semiconductor device to which the present invention is applied.

Referring to the cross sectional view of the semiconductor device shown in FIG. 1 to which the present invention is applied, a diffusion region 10 of a conventional semiconductor element, such as a transistor, is composed of a silicon base plate 11, a buried layer 12, a collector 13, a base 14, an emitter 15, and an insulation layer 16. The collector 13, the base 14 and the emitter 15 of the diffusion region 10 are connected by vias 17a, 17b and 17c to a connection pattern region 20. The connection pattern region 20 is composed of a first connection pattern 21, a second connection pattern 22, a third connection pattern 23, vias 24 which connect the first pattern 21 with the second pattern 22, and vias 25 which connect the second connection pattern 22 with the third connection pattern 23. The present invention relates to the second connection pattern 22, the third connection pattern 23 and the vias 25 as shown in FIG. 1. Hereinafter, we will refer to the second connection pattern 22 as the lower connection pattern, and to the third connection pattern 23 as the upper connection pattern.

Figure 2:
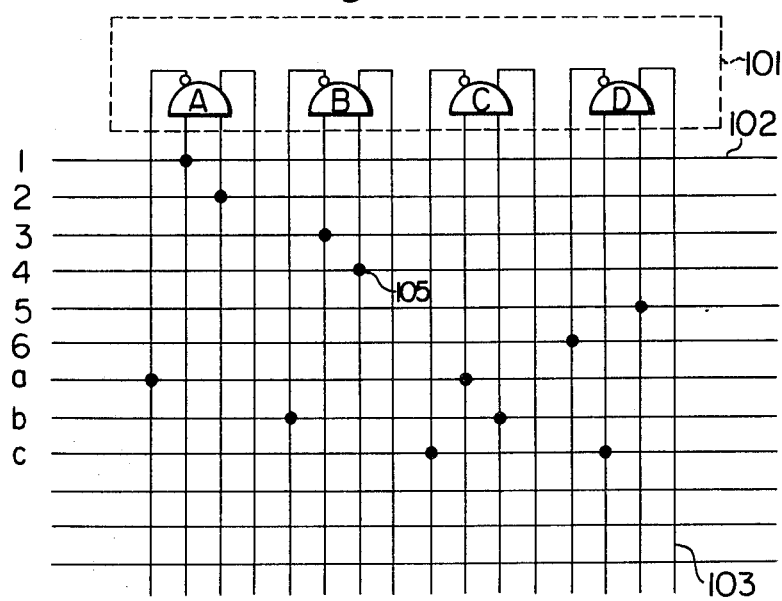
FIG. 2 shows one example of a first embodiment of the semiconductor device according to the present invention.
Figure 3:
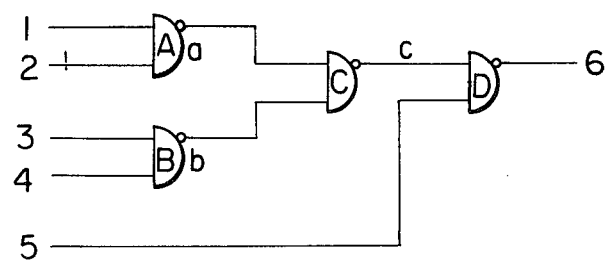
FIG. 3 shows a circuit which is related to the embodiment shown in FIG. 2.

FIG. 2 shows one example of the first embodiment of the semiconductor device according to the present invention. In FIG. 2, a basic pattern 101 including gate circuits A, B, C and D is formed on the semiconductor chip. Two groups of connection patterns 102 and 103 are also formed in the X and Y directions, respectively, as basic upper and lower patterns, by using the multilayer printed circuit technique. When it is desired to obtain a circuit as shown in FIG. 3, the upper and lower basic patterns 102 and 103 are connected at positions 105 which are marked by black circles, by using appropriate connection means such as, for example, through holes. Therefore, in FIGS. 1 and 2, numbers 1 through 5 of the patterns 102 in the X direction indicate input terminals; number 6 of the pattern 102 indicates an output terminal; and symbols a, b and c of the pattern 102 indicate connections between the gate circuits A, B, C and D, respectively.

As shown in FIG. 2, the gate circuits A, B, C and D are arranged on the semiconductor chip in a pattern which is applied to many kinds of circuits. Furthermore, the connection patterns 102 and 103 are standardized in the X and Y directions. A mask which is used for creating the connection between connection patterns 102 and 103 is utilized only for the purpose of forming the desired circuit. Accordingly maintenance of the mask is very simple, and production of the semiconductor device at a low cost is possible even if the amount of total production of the manufactured devices is small.

Figure 4:
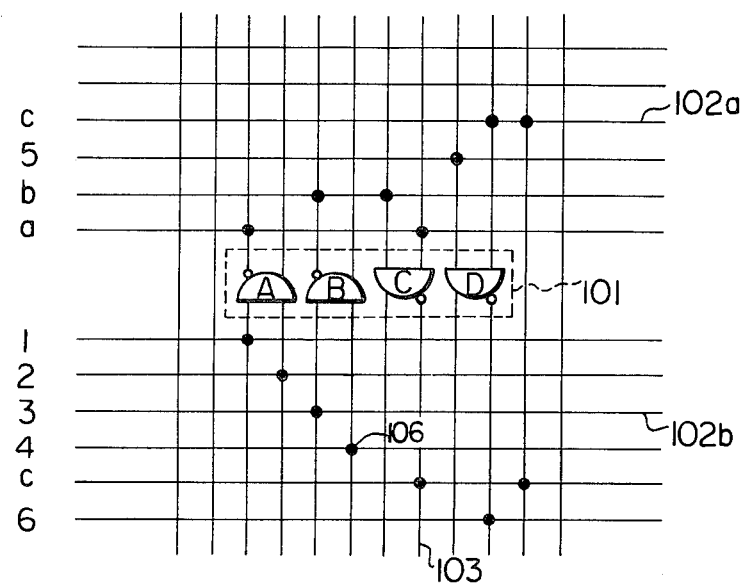
FIG. 4 shows another example of the first embodiment of the semiconductor device according to the present invention.

FIG. 4 shows a modified example of the first embodiment shown in FIG. 2. In the example shown in FIG. 4, the group of connection patterns 102 in the X direction is divided into two groups 102a and 102b, which are connected to the gate circuits A, B, C and D. The patterns 102a, 102b are respectively connected to patterns 103 by connecting means at positions 106 which are marked by black circles as shown in FIG. 4, thereby forming the circuit as shown in FIG. 3.

Figure 5:
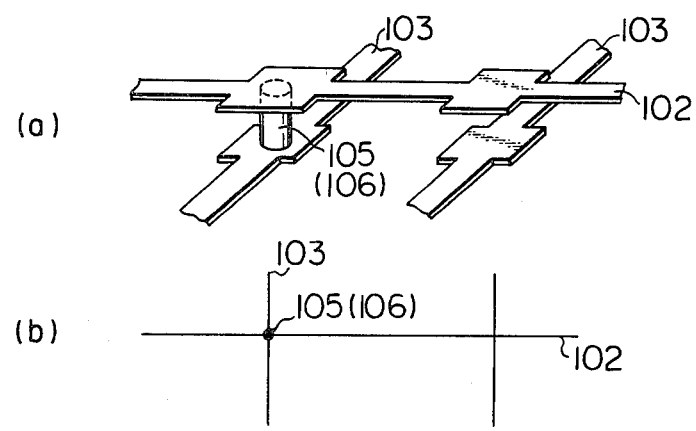
FIG. 5(a) shows in perspective connection means for connecting a lower connection pattern to an upper connection pattern as shown in FIG. 2 and FIG. 4.
FIG. 5(b) shows the equivalent electrical schematic therefor.

FIG. 5 shows the connection means which exists between the connection patterns 102 (102a, 102b) and 103. In FIG. 5, the connection patterns 102 and 103 are connected at an intersection point by the connection means vias 105(106). The formation of the connection means vias is carried out as shown in the following steps.

First, the connection for vias is formed;

secondly, the insulation layer composed of insulation material such as silicondioxide (SiO$_2$) is formed over the entire surface by the chemical vapor deposit (CVD) method;

thirdly windows are opened in the insulation layer by using a mask as used for forming a connection pattern;

fourthly, a metal layer selectively etched to form the pattern 102 is formed on the insulation layer, and;

fifthly, said metal is patterned by using another mask for forming said pattern 102.

Figure 6A:
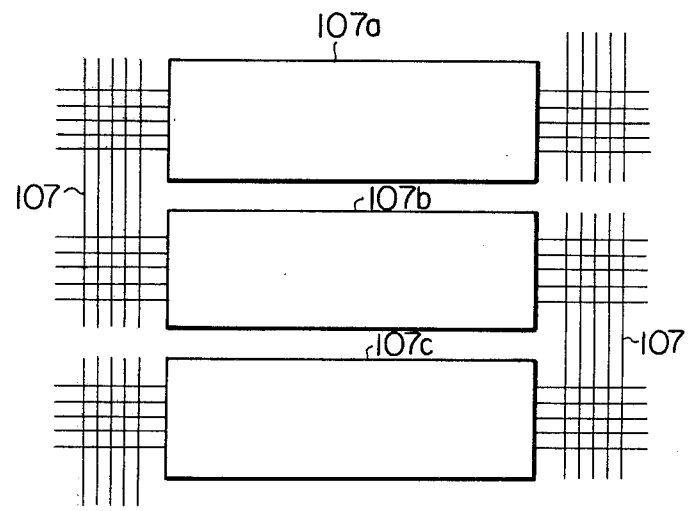
FIGS. 6A and 6B show connection patterns which connect the basic patterns shown in FIG. 2 or FIG. 4.
Figure 6B:
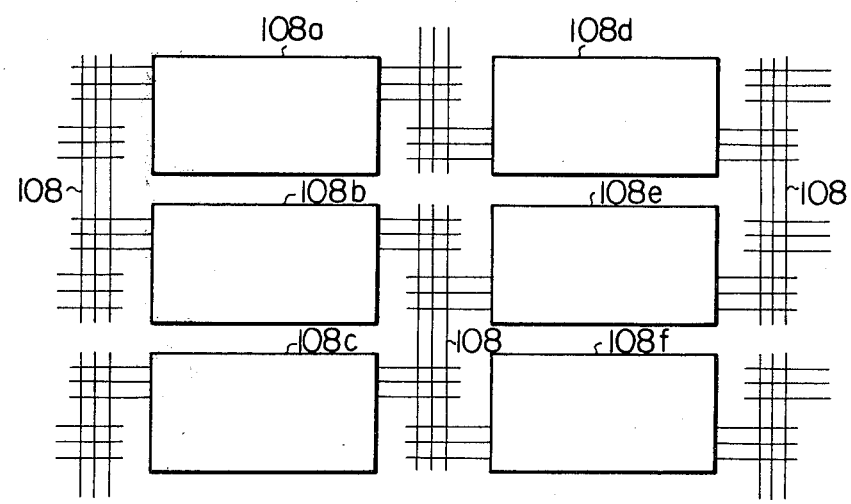

FIGS. 6A and 6B indicate the connection patterns 107 and 108 for connecting the basic patterns 107a through 107c and basic patterns 108a through 108f which are each composed of the gate circuits A through D as shown by the basic pattern 101 in FIGS. 2 and 4. These connection patterns 107 and 108 are connected to the blocks 107a through 107c and 108a through 108f by using the method shown in FIG. 5.

Figure 7:
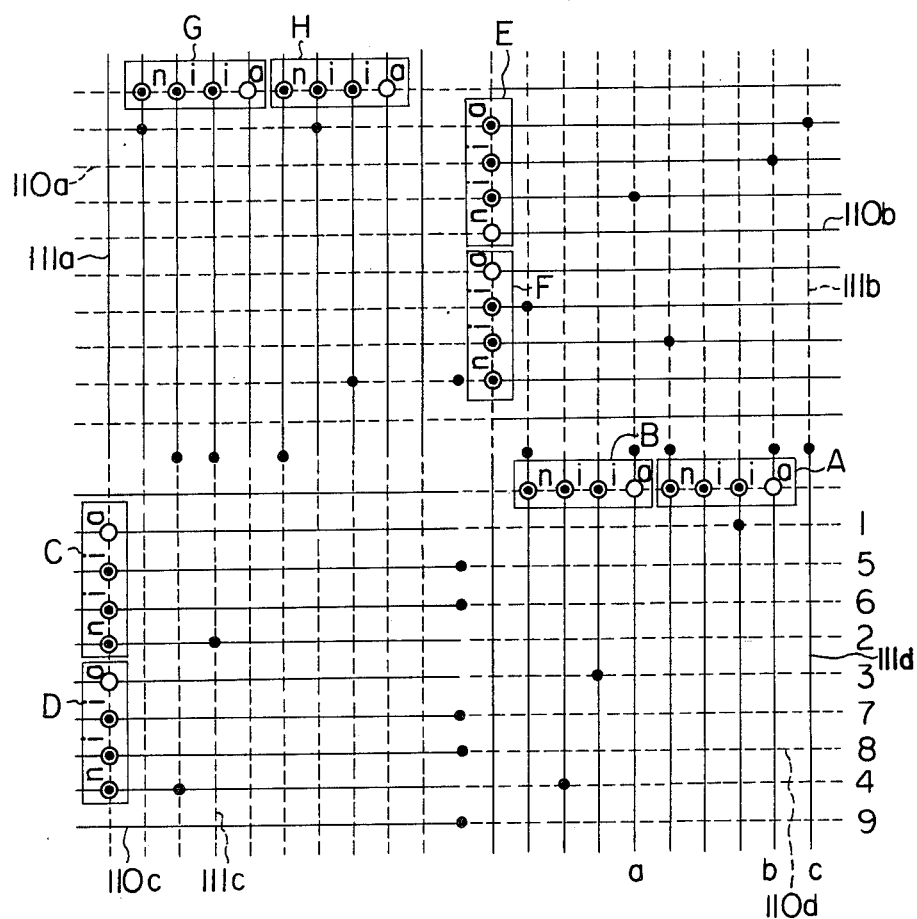
FIG. 7 shows a modified example of the first embodiment of the semiconductor device according to the present invention.

When the connection patterns 102 and 103 are used as the basic pattern, the length of the connection wire used is longer than the required length, and the operation speed of the circuit sometimes cannot be increased. Therefore, the basic connection patterns shown in FIG. 7 are used. In FIG. 7, the connection patterns are divided into a plurality of connection patterns 110a, 110b, 110c, 110d, 111a, 111b, 111c and 111d. The patterns 110a, 111b, 111c and 110d shown in dotted lines are formed as the lower patterns, and the patterns 110b, 111a, 110c and 111d shown in solid lines are formed as the upper patterns. Terminal ends of the patterns overlap each other for connecting with each other, if necessary.

FIG. 8A shows the basic pattern 112 of a gate circuit which is connected to the connection patterns as shown in FIG. 7. The connecting position of terminals "n," "i," "i" and "a" of the basic pattern 112 in FIG. 8A are shown in FIGS. 8A and 8B. When the upper and lower patterns are connected at the points which are marked by the black circles in FIG. 7, a logical circuit as shown in FIG. 9 is obtained. In FIGS. 7 and 9, the connection pattern having the numbers 1 through 8 and the symbols a, b are used as input terminals, and the connection patterns having the number 9 and the symbol c are used as output terminals. Furthermore, with the connection patterns shown in FIG. 7, it is suitable that the terminals "a," "i" and "n" of the gate circuits be formed as shown in (b) of FIG. 8B and in (b) of FIG. 8C.

For example, according to the embodiment using the basic connection patterns shown in FIG. 7, when 186 two-input gate circuits, 75 three-input gate circuits, and 32 five-input circuits were formed by using the connection patterns shown in FIG. 7, various kinds of semiconductor devices were able to be obtained by only utilizing the mask used for forming the connection means vias.

Figure 10A:
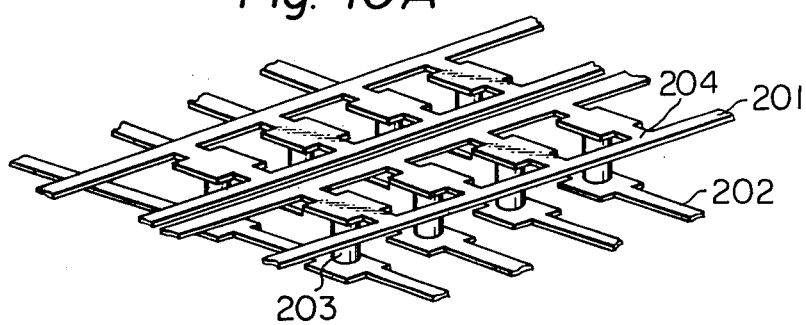
FIGS. 10A, 10B and 10C show the principle of constructing a second embodiment of the semiconductor device according to the present invention.
Figure 10B:
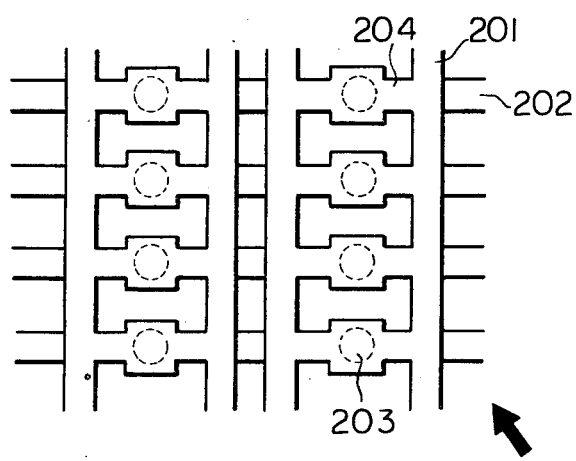
Figure 10C:
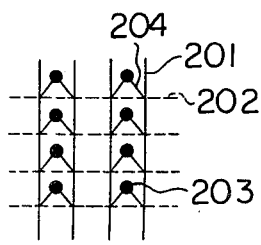

FIGS. 10A, 10B and 10C show a basic pattern of the second embodiment of the semiconductor device according to the present invention. In FIG. 10A, a connection pattern 201 is positioned on the upper layer; and a connection pattern 202 is positioned on the lower layer. Said connection patterns 201 and 202 are connected by the connection means "vias" 203. FIG. 10B is a plan view of the connection pattern shown in FIG. 10A. FIG. 10C is a simplified circuit of the connection pattern shown in FIG. 10A. It is understood that, in FIG. 10C, the connection patterns 201 and 202 are positioned in different layers. Lines 204 indicate that these two patterns 201 and 202 were originally connected to each other, and these lines 204 are removed for forming a required connection for obtaining the desired circuit.

Figure 11:
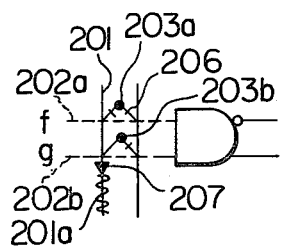
FIG. 11 is one example of a gate circuit which is formed by using the pattern shown in FIG. 10C.

FIG. 11 is one example of the gate circuit which is formed by using the pattern shown in FIG. 10C. Referring to FIG. 11, marks 206 show cut marks which remove the lines 204, and mark 207 shows a cut mark which removes the longitudinal connection pattern 201a. These marks show that the connection between the pattern 201 and 202a is disconnected. Further, the connection between pattern 201 and 202b is not removed, but the unnecessary portion 201a of the pattern 201 is removed.

Figure 12:
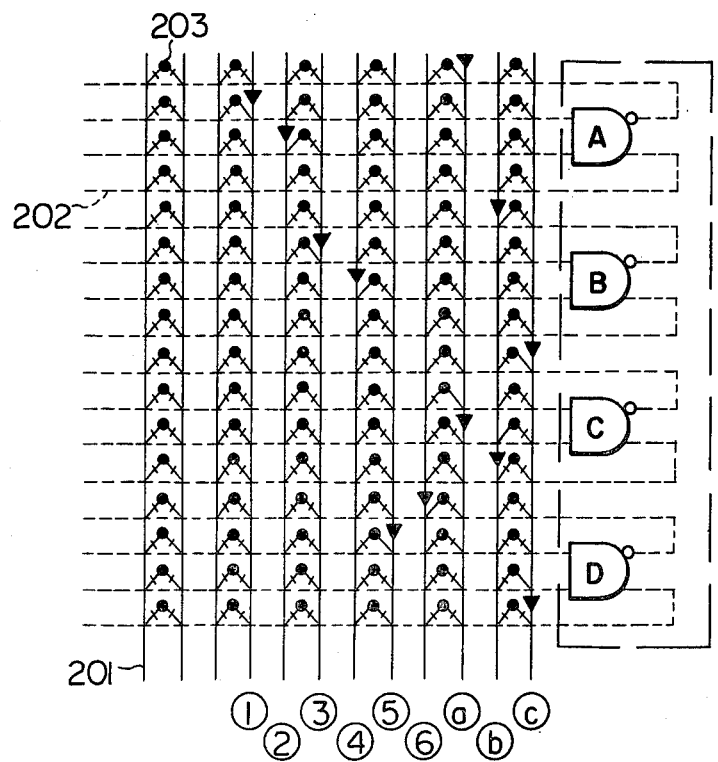
FIG. 12 is one example of the second embodiment of the semiconductor device according to the present invention.

FIG. 12 shows one example of the semiconductor device which is formed by using a method of the second embodiment shown in FIGS. 10A, 10C, and 11, whereby the same logic circuit as shown in FIG. 3 is obtained by constructing the connection pattern shown in FIG. 12. Referring to FIG. 12, input terminals 1, 2 and 3, 4 are connected respectively to NAND gates A and B; the outputs a and b of the NAND gates A and B are connected to a NAND gate C; the output c of the NAND gate C and an input terminal 5 are connected to a NAND gate D; and the output of the NAND gate D is connected to an output terminal 6.

For the purpose of obtaining the circuit shown in FIG. 12, the following manufacturing process is used. First, the lower connection pattern 202 is formed above an insulation layer which is formed directly above the semiconductor element by utilizing an evaporation method which uses an ordinary mask. Secondly, the vias 203 are formed as a middle layer, and upon which the upper connection pattern 201 is formed. The lower pattern, upper pattern and the middle pattern are also formed by using the standardized pattern which is used generally for manufacturing various large scale integration (LSI) circuits.

By removing the lines 204 which are positioned at unnecessary portions, a special pattern of the circuit to be manufactured is formed on the upper connection pattern 201.

Next, is described the method for removing the unnecessary lines 204. Which lines 204 are to be removed is previously determined by computer means in such a manner that the resultant circuit constitutes only a minimum number of the redundant connection wires. The removal of the unnecessary lines is carried out by using a light beam, for example a laser beam, or by etching with a mask.

Figure 13A:
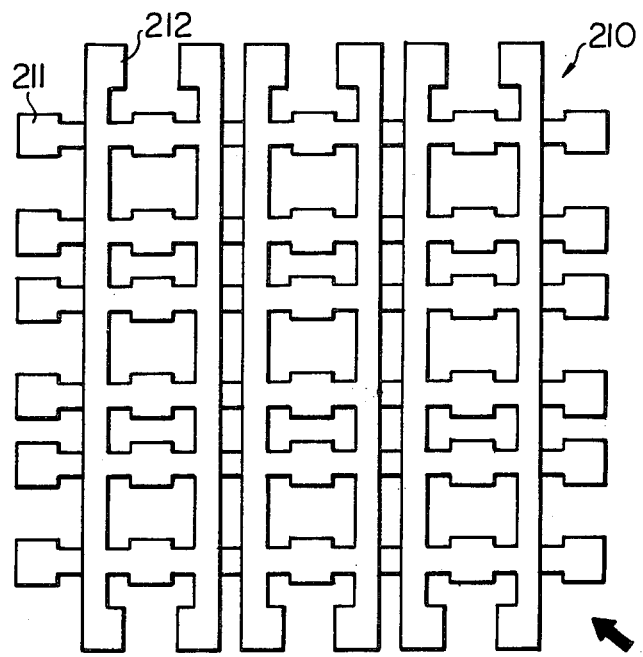
FIGS. 13A, 13B and 14 show a modified example of the second embodiment of the semiconductor device according to the present invention.
Figure 13B:
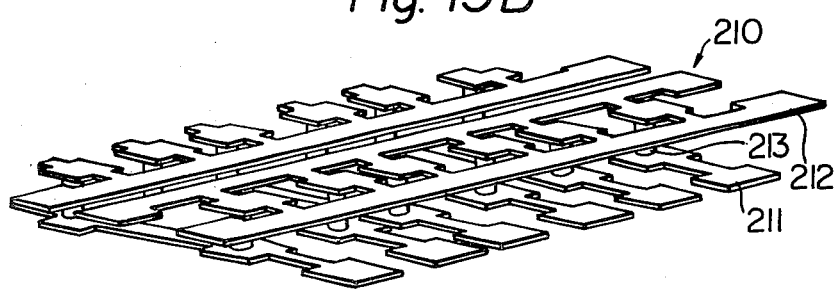
Figure 14:
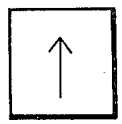
Figure 14:
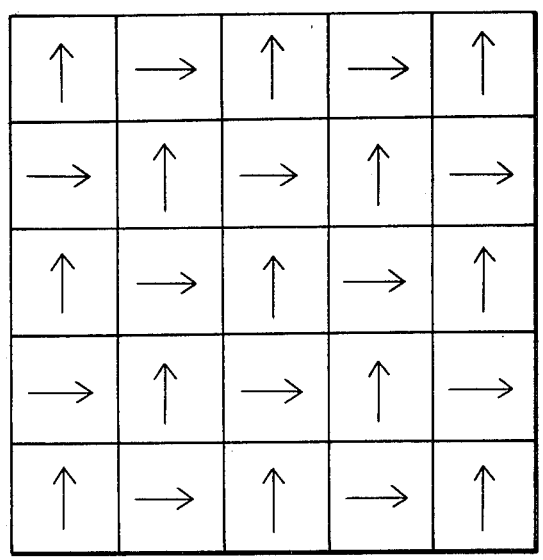

Now the method for preparing the redundant connection wires in the lower standardized connection pattern is described. Referring to FIG. 12, the standardized connection pattern 202 in the lower layer includes many unnecessary connection patterns. In large-scale integration circuits, such unnecessary connection patterns decrease the operation speed of the final resultant circuit. For the purpose of overcoming the above-mentioned disadvantage, the connection pattern as shown in FIGS. 13A, 13B and 14 is used. In FIG. 13A, the unit pattern 210, which is composed of connection patterns 211 and 212, has a suitable predetermined length. The upper pattern 212 and the lower pattern 211 are connected by vias 213 as shown in FIG. 13B. The unit patterns 210 as shown in FIGS. 13A and 13B are connected in a checkered pattern manner as shown in FIG. 14. That is, the connection patterns having the same direction in adjacent unit patterns are alternately positioned on the upper layer and on the lower layer similarly to the patterns shown in FIG. 7, wherein the unnecessary connection patterns are removed from the upper layer.

Figure 15A:
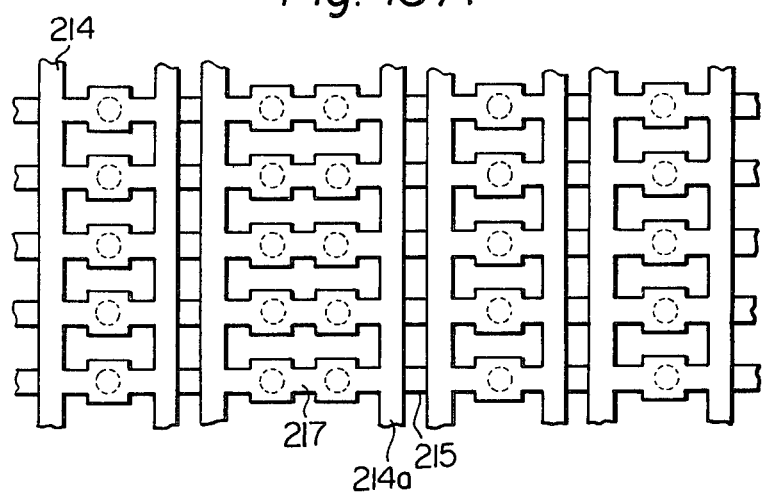
FIGS. 15A and 15B show another modified example of the second embodiment of the semiconductor device according to the present invention.
Figure 15B:
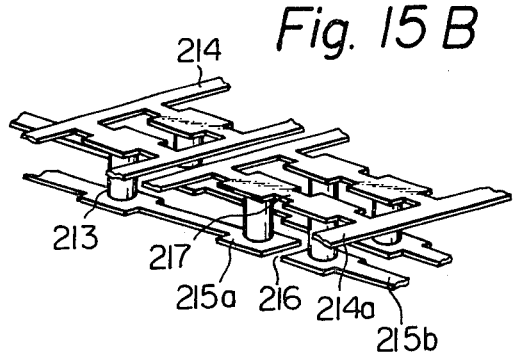

In the connection patterns as shown in FIGS. 15A and 15B, the connection pattern on the upper layer is composed of connection wires 214 and 214a, and the connection pattern in the lower layer is composed of connection wires 215a and 215b which are separated by a gap 216. The separated portions in the lower layer with gap 216 are connected by the connection pattern 217 in the upper layer. Thus, the unnecessary portions of the connection pattern in the lower layer can be removed by disconnecting said connection pattern 217.

Figure 16A:
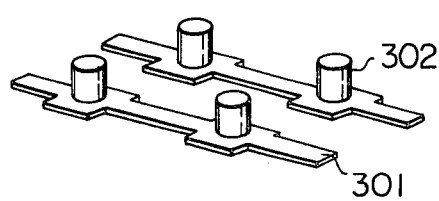
FIGS. 16A and 16B, 17A, 17B and 17C show the principle of constructing a third embodiment of the semiconductor device according to the present invention.
Figure 16B:
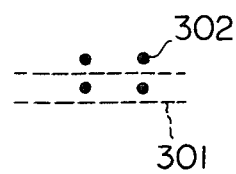
Figure 17A:
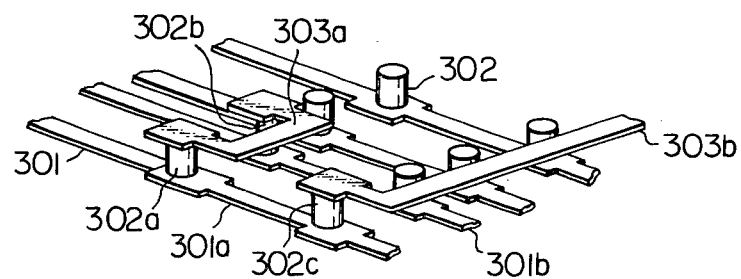
Figure 17B:
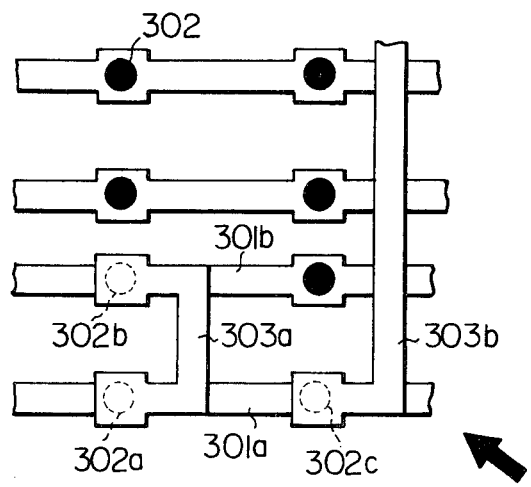
Figure 17C:
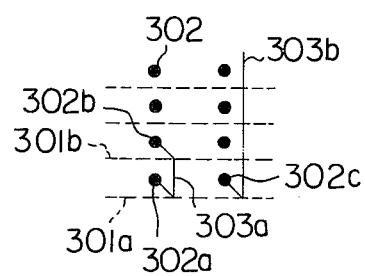

FIGS. 16A, 16B, 17A, 17B and 17C show a basic pattern of the third embodiment of the semiconductor device according to the present invention. FIG. 16A shows a lower connection pattern 301 and vias 302 which connect the lower connection pattern to a higher connection pattern (not shown in FIG. 16A). FIG. 16B is a simplified equivalent diagram which shows the connection pattern in FIG. 16A. FIG. 17A shows the relationships among the lower connection pattern 301, vias 302 and the upper connection patterns 303a, b. The lower connection pattern 301 in FIGS. 16A and 17A is a standardized and fixed connection pattern. A connection pattern 301a is connected by via 302a to a connection pattern 303a, and is further connected by "via" 302b to a connection pattern 301b. Also, the connection pattern 301a is connected by via 302c to a connection pattern 303b. FIG. 17B is a plan view of the connection patterns shown in FIG. 17A. In FIG. 17B, the upper connection patterns 303a and 303b are formed by using a mask as used for manufacturing the large-scale integrated circuit. FIG. 17C is a simplified equivalent diagram which shows the connection patterns in FIGS. 17A and 17B.

Figure 18:
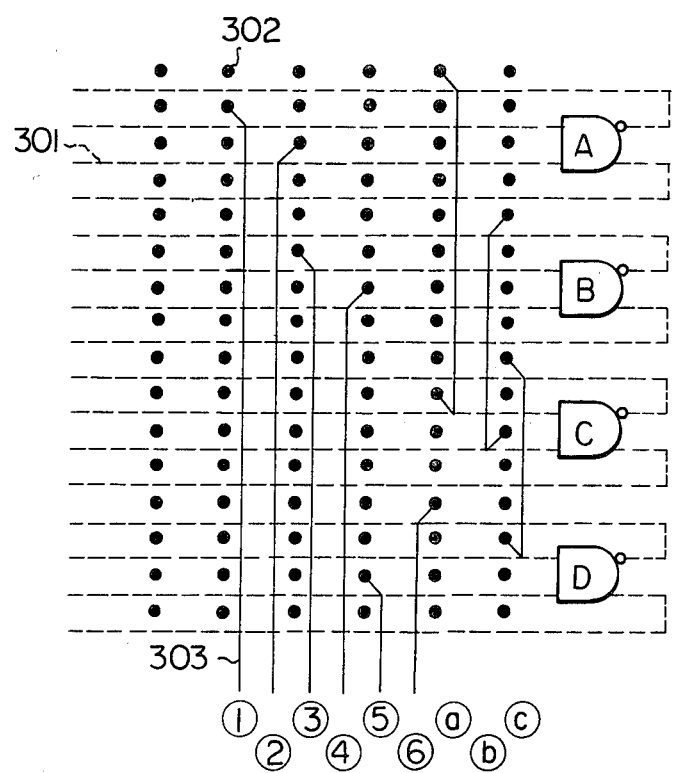
FIG. 18 shows one example of the second embodiment of the semiconductor device according to the present invention.

FIG. 18 shows one example of the circuit formed by the third embodiment of the present invention. An equivalent circuit which is created by the connection patterns shown in FIG. 18 is the same as that shown in FIG. 3. In the semiconductor device which is formed by the embodiment shown in FIG. 18, the upper connection pattern 303 is formed by using the mask conventionally used for manufacturing the semiconductor device.

When the large-scale integrated circuit is manufactured by means of the third embodiment of the present invention, it is understood that the methods which are described and shown with reference to FIGS. 13A, 13B, 14, 15A and 15B are applicable for the purpose of processing the redundant connections on the lower standardized connection pattern 301.

As mentioned above, according to the present invention, the lower standardized connection pattern can be widely used for various large-scale integrated circuits. In which cases, only the upper connection pattern is formed in accordance with the desired circuit. Consequently, the number of masks required to be prepared is very small and the time necessary for manufacturing the semiconductor device can be decreased, thereby considerably reducing the manufacturing costs of said device.

What is claimed is:

1. A semiconductor device having a plurality of circuit elements formed therein, each of said plurality of circuit elements having more than one input terminal and each of said plurality of circuit elements having more than one output terminal, said semiconductor device having means for obtaining many kinds of desired circuits from the commonly formed device including a first connection layer having a standard pattern consisting of a plurality of redundant connection wires which are permanently connected to said output and input terminals of said plurality of circuit elements with said connection wires being arranged in parallel relationship to each other, a second connection layer which is arranged over the connection wire of said first connection layer and separated therefrom by an insulating layer, and consisting of a plurality of redundant connection wires arranged in parallel relationship to each other, and further arranged in a direction which intersects the parallel direction of the connection wires of said first connection layer, and means provided with said insulating layer between said first and second connection layers for providing interconnections therebetween, including via portions electrically connecting said first and second connection wires at cross points of said first and second connection wires.

2. A semiconductor device according to claim 1 wherein the connection wires of said second connection layer are used as standard connection wires regardless of whatever desired circuit is finally obtained;
and said via portions are only formed at predetermined ones of the cross points of the standard pattern redundant connection wires of said first and second connection layers for obtaining a desired circuit.

3. A semiconductor device according to claim 1, wherein the redundant connection wires of said second connection layer are used as standard connection wires regardless of the desired circuit finally obtained;
said via portions in said insulating layer being formed at all of the cross points of the connection strips of said first and said second connection layers;
and predetermined parts of said standard connection strips of said second connection layer being cut out for obtaining a desired circuit.

4. A semiconductor device according to claim 1, wherein said via portions of said insulating layer provides standard connection via portions which are respectfully connected to predetermined points of the standard wires of said first connection layer;
said connection via portions at said predetermined positions being selectively connected by the connection wires of said second said connection layer in accordance with a desired circuit to be obtained.

5. A semiconductor device according to claim 3, wherein said standard pattern redundant connection wires of said second connection layer is cut by means of a laser beam at predetermined portions.

6. A semiconductor device according to claim 3, wherein said standard pattern redundant connection wires of said second connection layer are cut by using a mask etching process at predetermined portions thereof.

7. A semiconductor device according to claim 1, wherein a plurality of the circuit elements are divided into a plurality of groups, each of the standard pattern of redundant connection wires of said first connection layer corresponding to the circuit elements of one group being connected to the standard pattern of redundant connection wires of said second connection layer corresponding to said circuit elements of another group.

8. A semiconductor according to claim 1, wherein each of said first and second connection layers, and said insulating layer therebetween having via portions for the interconnections are divided into a plurality of regions, each standard pattern of redundant connection wires of said first connection layer of each region being respectively connected to each standard pattern of redundant connection wires of said second connection layer of another adjacent region, and the connection wires of said second connection layer to said each region being connected to the standard connections wires of said first connection layer of another adjacent region.

9. A semiconductor device which includes at least one semiconductor chip forming circuit element thereon and connection patterns connected to said circuit element or elements, wherein said connection patterns comprise a lower connection pattern, which is standardized, which has a plurality of wire connection patterns arranged in parallel and which is commonly applied to many kinds of circuits, and an upper connection pattern which is standardized and positioned on the upper side of said lower connection pattern, and which has a plurality of wire patterns arranged in parallel and having a direction of about a right angle with respect to said lower connection pattern, and which is commonly applied to many kinds of circuits, vias which are standardized and arranged at all cross positions of said upper connection pattern and said connection patterns, and which are applied to many kinds of circuits, and wherein said upper connection pattern is formed by removing the lines of said upper connection pattern at positions which are not necessary for obtaining the desired circuit.

10. A semiconductor device which includes at least one semiconductor chip forming circuit element thereon and connection patterns connected to said circuit element or elements, wherein said connection pattern comprises a lower connection which is standardized, which has a plurality of wire connection patterns arranged in parallel and which is commonly applied to many kinds of circuits, vias which are positioned at standardized positions, and which are commonly applied to many kinds of circuits and an upper connection pattern which is formed in a special pattern for obtaining the desired circuit and which has a direction having about a right angle with respect to said lower connection pattern and vias which are necessary for obtaining the desired circuit are connected.

11. A semiconductor device which includes at least one semiconductor chip forming circuit element thereon and connection patterns connected to said circuit element or elements, wherein said connection patterns comprise a lower connection pattern, which is commonly standardized, which has a plurality of wire connection patterns arranged in parallel and which is applied to many kinds of circuits, and an upper connection pattern which is standardized and positioned on the upper side of said lower connection pattern, and which has a plurality of wire patterns arranged in parallel and having a direction of about a right angle with respect to said lower connection pattern, and which is commonly applied to many kinds of circuits, and said upper connection pattern and said lower connection pattern are connected at necessary positions for obtaining the desired circuit.

* * * * *